United States Patent [19]
Ward et al.

[11] Patent Number: 5,568,361
[45] Date of Patent: Oct. 22, 1996

[54] THREE-DIMENSIONAL ELECTRONIC CIRCUIT OF INTERCONNECTED MODULES

[75] Inventors: Stephen A. Ward, Chestnut Hill; Gill A. Pratt, Wellesley; John N. Nguyen; John S. Pezaris, both of Cambridge, all of Mass.

[73] Assignee: Massachusetts Institute of Technology, Cambridge, Mass.

[21] Appl. No.: 279,693

[22] Filed: Jul. 25, 1994

Related U.S. Application Data

[63] Continuation of Ser. No. 852,603, Mar. 17, 1992, abandoned.

[51] Int. Cl.$^6$ .................. H05K 7/00; H05K 7/02; H01R 23/68; H01R 23/72

[52] U.S. Cl. .............. 361/735; 361/729; 361/784; 361/785; 361/790; 361/803; 439/74

[58] Field of Search .................. 257/686; 273/153 P, 273/160; 310/328, 309, 330, 332; 361/729, 730, 731, 733, 735, 784, 785, 790, 791, 803; 437/51, 208, 915; 439/44, 45, 47, 68, 69, 74, 55; 446/120, 121, 122, 124, 125, 127

[56] References Cited

U.S. PATENT DOCUMENTS

| | | | |
|---|---|---|---|
| 1,472,536 | 10/1923 | Thomson | 361/735 |
| 2,967,267 | 1/1961 | Steinman et al. | 361/730 |
| 3,594,689 | 7/1971 | Hopt et al. | 439/44 |
| 4,423,465 | 12/1983 | Teng-Ching et al. | 361/730 |
| 4,499,607 | 2/1985 | Higgins | 361/784 |
| 4,587,594 | 5/1986 | McPherson | 361/694 |
| 4,727,410 | 2/1988 | Higgins, III | 257/686 |
| 4,733,461 | 3/1988 | Nakano | 361/784 |
| 4,742,552 | 5/1988 | Andrews | 382/41 |
| 4,833,568 | 5/1989 | Berhold | 361/735 |
| 4,954,458 | 9/1990 | Reid | 437/51 |
| 4,983,533 | 1/1991 | Go | 437/7 |
| 5,000,713 | 3/1991 | Cheng | 273/160 |
| 5,006,920 | 4/1991 | Schafer et al. | 257/686 |
| 5,016,138 | 5/1991 | Woodman | 361/790 |
| 5,051,865 | 9/1991 | Kato | 361/386 |
| 5,113,117 | 5/1992 | Brooks et al. | 361/735 |

FOREIGN PATENT DOCUMENTS

| | | |
|---|---|---|
| 3616821 | 11/1987 | Germany. |
| 61-99361 | 5/1986 | Japan. |
| 61-101067 | 5/1986 | Japan. |
| 61-168951 | 7/1986 | Japan. |
| 1-136360 | 5/1989 | Japan. |
| 0129955 | 5/1990 | Japan. |
| 2-199859 | 8/1990 | Japan. |
| WO91/19258 | 12/1991 | WIPO. |

OTHER PUBLICATIONS

M. J. Little et al., "The 3-D Computer," *Journal of VLSI Signal Processing*, vol. 2, No. 2, Oct. 1990.

Gaensslen, "Multichip Packaging", *IBM Disclosure Bulletin*, (Mar. 1970), vol. 12, No. 10, pp. 1579–1580.

Shin, "HARTS: A Distributed Real Time Architecture," *IEEE*, pp. 25–35 (May 1991).

Chen, et al., "Addressing, Routing and Broadcasting in Hexagonal Mesh Multiprocessors," *IEEE Trans. on Computers*, vol. 39, No. 1, pp. 10–18 (1990).

*Primary Examiner*—Donald A. Sparks
*Attorney, Agent, or Firm*—Hamilton, Brook, Smith & Reynolds, P.C.

[57] ABSTRACT

Circuit supporting modules form a three-dimensional communication interconnect mesh. Each module has fewer than six sets of connectors, preferably four. The preferred three-dimensional communication interconnect is a tetrahedral lattice having a regular, isotropic, three-dimensional topology in which each module connects to its four physically closest neighbors. The structure of the tetrahedral interconnect is isomorphic with a diamond lattice structure.

31 Claims, 6 Drawing Sheets

THREE-DIMENSIONAL ELECTRONIC CIRCUIT OF INTERCONNECTED MODULES

GOVERNMENT FUNDING

This invention was made with government support under Grant Number N00014-89-J-1988 awarded by the Department of the Navy. The government has certain rights in the invention.

RELATED APPLICATION

This application is a continuation of application Ser. No. 07/852,603 filed on Mar. 17, 1992, now abandoned, which is incorporated herein by reference in its entirety.

BACKGROUND OF THE INVENTION

This invention relates generally to the field of computer architecture. Typically, computers include an interconnected set of computational modules, each performing a specific task or function. These modules are assembled into a full system by connecting the appropriate wires that lead in and out of each through a bus. The bus allows various computer chips or boards to communicate and exchange data. This standardized approach has allowed system designers to physically arrange components in any manner they require without worrying about the details of interconnections.

However, the bus architecture seriously constrains the efficiency of communication among modules. This is a key limitation in today's quest for faster, more efficient computers. Since buses serialize all communications, they create a bottleneck. To make matters worse, the total capacity of the intercommunication remains roughly constant as the system size and the demand for the exchange of information increases. Moreover, the time taken by each transaction must accommodate the physical length of the bus, a crucial factor that limits the communication bandwidth in all but the shortest buses. These deficiencies reduce the viability of the bus as a basis for communication in modern computer systems.

To increase the efficiency in communication among modules, modern multiprocessor architectures have been designed with various different topologies other than the bus. Such topologies include one-dimensional, two-dimensional and three-dimensional topologies.

SUMMARY OF THE INVENTION

The size of future computer systems mandates the use of three-dimensional topologies for efficient utilization of space and communication bandwidth. For maximum flexibility, these topologies should have incremental expandability, arbitrary scalability and support fast static and dynamic communication.

The present invention provides a modular and high-performance communications substrate that standardizes the mechanical, electrical and logical interconnection among modules arranged in a three-dimensional mesh. This mesh is constructed of replicated near-neighbor links whose mechanical and electrical characteristics are rigidly constrained and highly optimized. These constraints allow performance parameters for non-local communications that compete favorably with those of the ad-hoc interconnects found in contemporary supercomputers.

In accordance with a preferred embodiment of the present invention, there is provided a three-dimensional electric circuit assembly. The assembly includes a plurality of modules to support respective circuits. Each module has at least three sets of connectors along fewer than six flat surfaces thereof. The connectors join the circuits on the substrate of adjacent modules. Adjacent modules are oriented relative to each other such that adjacent modules interconnect in a three-dimensional array.

The modules may take any form including circuit boards, semiconductor chips, multichip modules and housings of any shape. Circuit board modules with vertical top and bottom connectors are particularly suited to the assembly.

The preferred shape of the three-dimensional array is a tetrahedral lattice, wherein each of the joined modules communicate with four other modules. The preferred embodiment is isomorphic to a diamond lattice. The diamond lattice is particularly advantageous in that it is isotropic. Accordingly, each module has connectors for connecting to adjacent modules along four axes. Adjacent modules are connected along a single common axis but are rotated relative to each other such that connections from adjacent modules are made in opposite directions.

The assembly may be made from a plurality of flat modules with only vertical interconnections. Accordingly, each flat surface of a module may support a pair of like, parallel, extended connector sets. The connector sets on opposite surfaces of the substrates are complementary to each other and rotated 90° relative to each other. Modules are joined to adjacent modules such that the modules define a three-dimensional tetrahedral lattice.

In another embodiment, the three-dimensional circuit assembly is constructed from triangular shaped modules wherein each module communicates with three adjacent modules. The connectors may be formed on a top triangular surface, a bottom triangular surface and an edge of the module. Each connector extends along an axis transverse to an axis of connection, and the transverse axes are displaced 120° relative to each other.

The substrate of each module may support a plurality of circuit chips, and auxiliary circuit boards may be mounted to the substrates.

In the lattice which is isomorphic with the diamond lattice, each module is physically identical relative to connectors, but is oriented in one of two directions. Each module is connected only to modules of the opposite orientation. Each of the two orientations may also be identified with one of two-phases of a two-phase clock, so that no neighboring modules operate on the same clock phase in intermodule communications.

In a lattice structure which is isomorphic with the diamond lattice and which comprises flat overlapping modules, the modules may be spaced horizontally within levels of the lattice, thereby allowing paths for coolant flow and space for auxiliary boards. The resultant serpentine flow paths may then insure turbulent flow as coolant fluid, air or liquid, is directed therethrough.

The three-dimensional assemblies of the present invention may be addressed by a four element vector. Each vector element represents four non-orthogonal directions that a particular message being sent from a substrate may travel. The four element addressing system ensures that no two modules are assigned the same address and that no two addresses are assigned the same module.

The present invention further includes a preferred method of providing a three-dimensional circuit assembly. First, a plurality of modules are provided. Then circuits are placed over the plurality of modules. Next, adjacent modules are connected along module axes such that the connected modules are rotated relative to each other to form a three-dimensional array.

While the present invention will hereinafter be described in connection with a preferred embodiment and method of use, it will be understood that it is not intended to limit the invention to this embodiment. Instead, it is intended to cover all alternatives, modifications, and equivalents as may be included within the spirit and scope of the present invention as defined by the appended claims.

DETAILED DESCRIPTION OF THE INVENTION

Communication networks are characterized by their connectivity. Classification of networks depend on the number of nodes reachable in n time steps from a central node within an infinite network. If the number of reachable nodes grows linearly (e.g., a factor times the number of time steps plus a constant), the network is classified as one-dimensional and designated as $O(n)$. Similarly, if the number of reachable nodes grows quadratically, the network is classified as two-dimensional and designated as $O(n^2)$. Thus, if the number of distinct nodes grows as $n^3$, then the network is classified as three-dimensional and is designated as $O(n^3)$.

Each node in the network is connected to its neighbors through communications ports or connector sets. A node is characterized by the number of ports or the number of neighbors connected to the ports. A node having three ports is considered to be less complex than a node having six ports.

A description of a communications network can be formulated from the connectivity and the number of neighbors. For example, a series of two-port nodes strung together in a one-dimensional topology would be called a 1D-2N network; a collection of four-port nodes connected in a two-dimensional Cartesian mesh would be called a 2D-4N network. For certain combinations, this description is complete (e.g., there is only one 1D-2N network); for others, it is incomplete.

Figure 1:
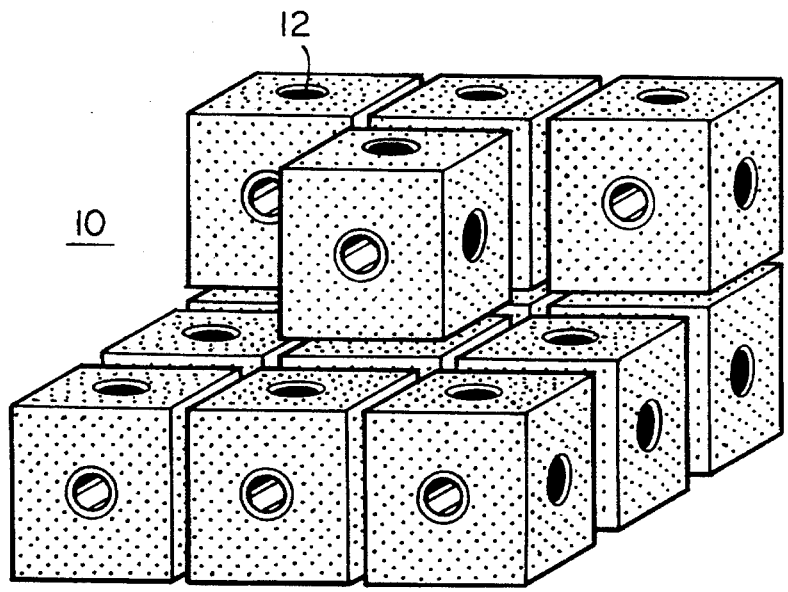
FIG. 1 shows a three-dimensional communication interconnect of the prior art.

A scalable, three-dimensional, 6-neighbor (3D-6N) communication interconnect or mesh 10 is illustrated in FIG. 1. The mesh includes substrates or modules or nodes 12 that are connected together to form a three-dimensional mesh. FIG. 1 depicts each module as a cube whose faces provide signal contacts as well as power and coolant to six immediate neighbors.

The present invention discloses various topologies that are more efficient and have a lower node complexity than the mesh shown in FIG. 1. The preferred topology of the present invention is a 3D-4N network.

Figure 2:
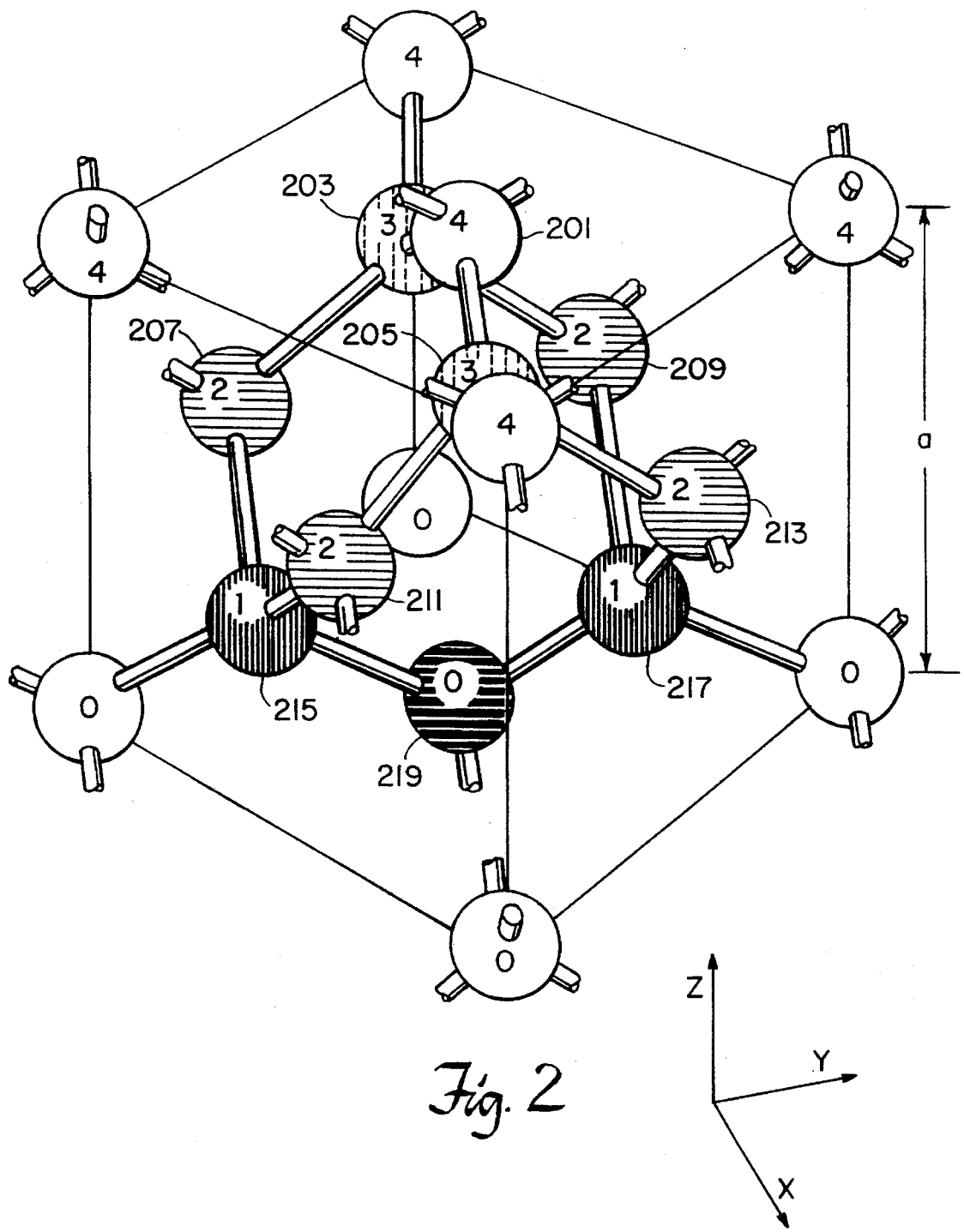
FIG. 2 shows a crystal structure of a diamond lattice to which one embodiment of the present invention is isomorphic.

The preferred 3D-4N network is based upon the crystal structure of a diamond lattice (i.e., crystalline carbon). The diamond lattice is incorporated in the 3D-4N mesh of the present invention and is shown in FIG. 2. In a diamond lattice, each carbon atom has four links or axes that bond with four neighboring atoms. An aggregate of four atoms form a unit cell which, when repeated, constitutes the complete crystalline lattice. In the 3D-4N, circuit supporting modules correspond to the carbon atoms with each being linked to four neighboring modules. We designate each module in the diamond lattice shaped 3D-4N mesh with a numeral (0,1,2,3,4) that is representative of their position level within the mesh. Substrates having a level 0 are positioned at the bottom of the mesh, substrates of level 1 are positioned above level 0 substrates, level 2 substrates are positioned above level 1 substrates, then level 3 is the next highest level, and level 4 occupies the top level. Level 4 can then be labeled level 0 for the next group of the repeated lattice structure. The levels of the mesh are joined together by connecting each substrate's axes to substrates at adjacent levels. For example, each level 0 (4) substrate is linked to the axes of two level 1 and two level 3 substrates. Each level 1 substrate is linked to two level 0 and two level 2 substrates. Each level 2 substrate is linked by its four axes to two level 1 and two level 3 substrates. After linking all of the substrates together, the 3D-4N mesh has the form of a diamond lattice.

Figure 3:
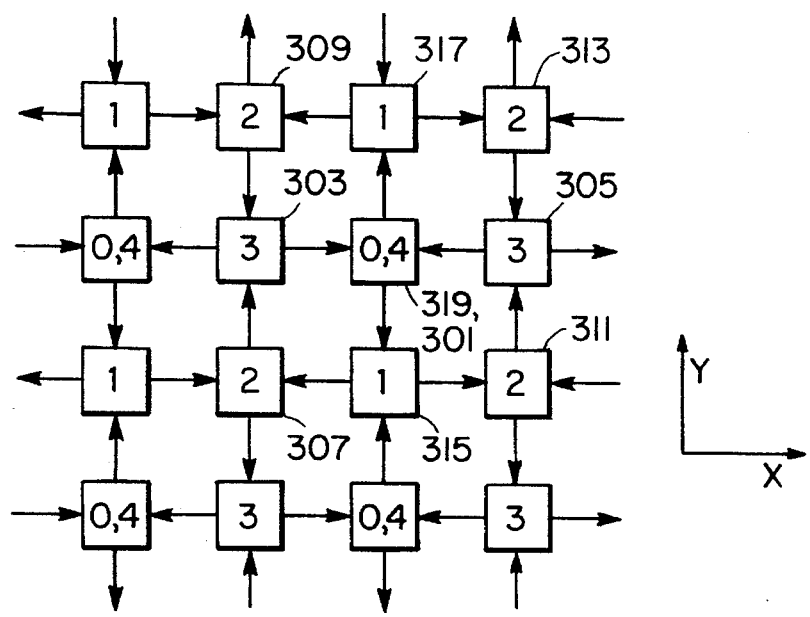
FIG. 3 is a rectilinear array remapping the atoms of the diamond lattice.

This 3D-4N tetrahedral mesh can be further conceptualized by using an orthogonal array of mechanically homogeneous nodes that are remapped by projection onto a plane from the diamond lattice shown in FIG. 2. FIG. 3 shows a rectilinear array of the remapped atoms. The nodes or substrates in FIG. 3 are numbered to show the relative heights and levels of corresponding atoms in the diamond lattice cell. Links between the nodes of FIG. 2 are represented in FIG. 3 as arrows pointing towards nodes positioned at higher layers. The arrows between each respective node represent a horizontal and vertical link. For instance, the arrow between a pair of nodes labeled 3 and 4 represent a link horizontally and vertically to a node in the level 4, which is directly above a level 0 node and the level 0 node of the next set of levels.

The 3D-4N mesh of the present invention is derived from the rectilinear array of FIG. 3 by reducing the internode spacing and offsetting alternate layers in the x and y directions, allowing contacts on overlapping horizontal surfaces to effect communications in the x direction at the level 1/2 and level 3/0 boundaries, and in the y direction at the level 0/1 and level 2/3 boundaries.

Figure 4A:
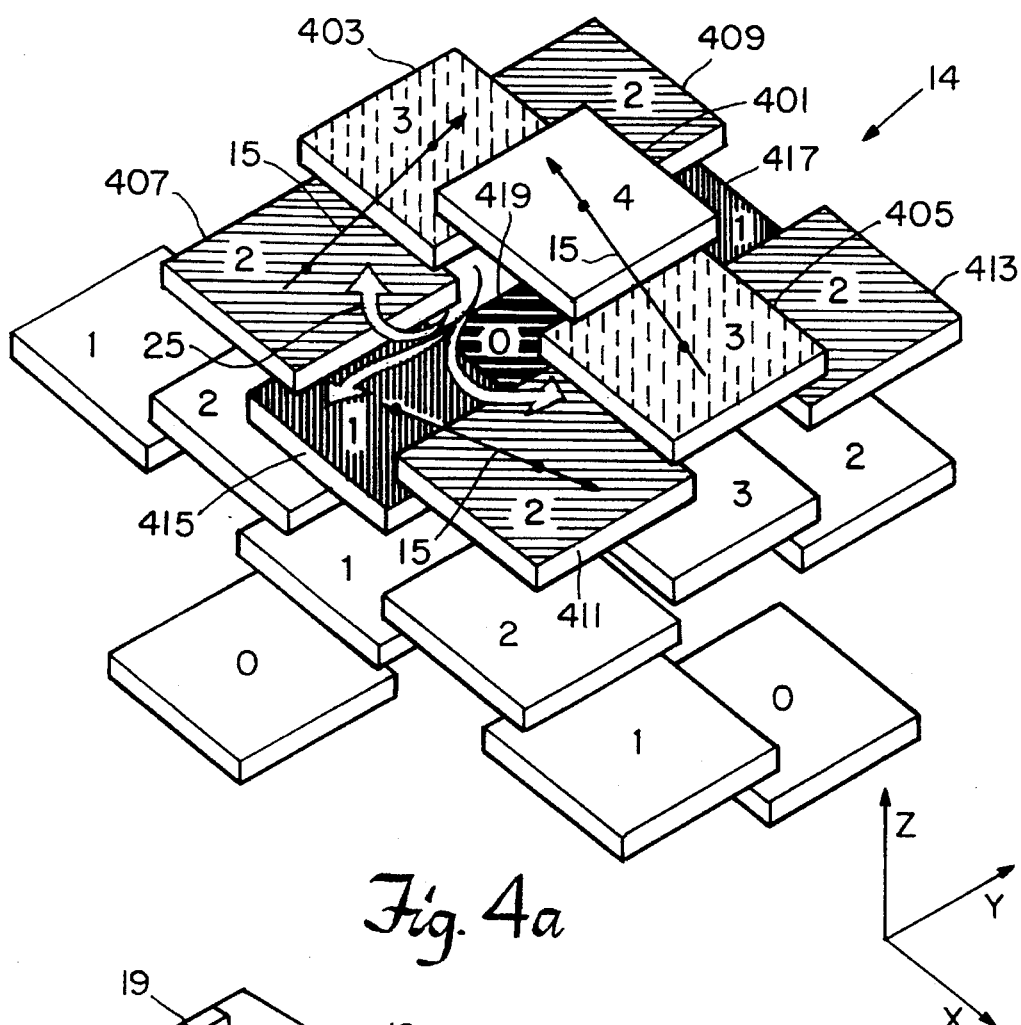
FIG. 4a shows an exploded view of 3D tetrahedral interconnect with four connector sets at each node to connect to four neighbors (4N).
Figure 4B:
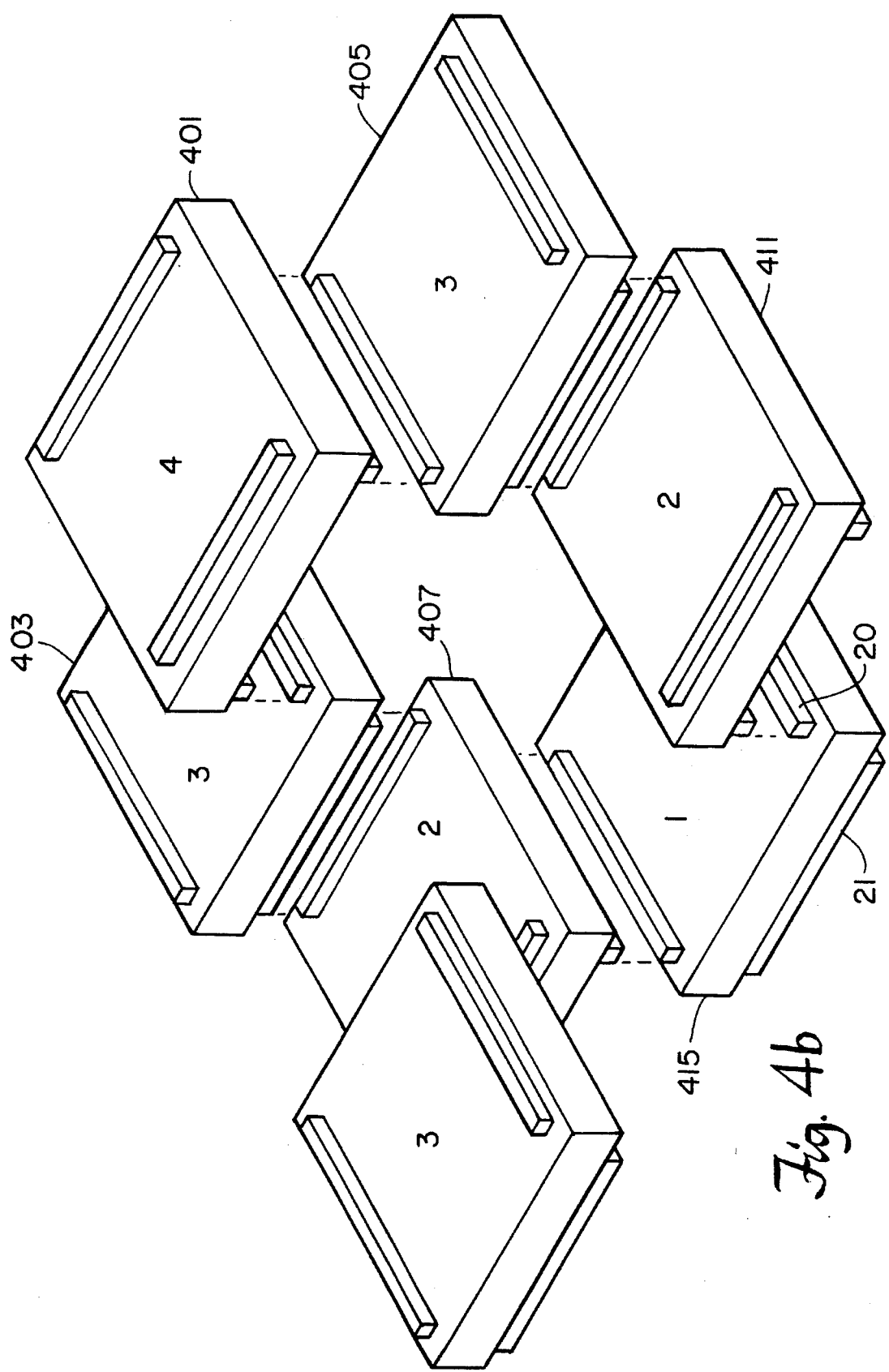
FIG. 4b shows interconnection of several of the modules of FIG. 4a with connectors illustrated.

FIG. 4a shows the 3D-4N mesh 14 having five levels of modules that correspond to the tetrahedral lattice in FIG. 2 and to the rectilinear array of FIG. 3. The 3D-4N tetrahedral interconnect includes a plurality of flat surfaced modules or modules or nodes 16 which each support respective circuits 18 (FIG. 4b). The lowest substrate level of mesh 14 is represented by a level 0. The next highest substrate level is represented by level 1, then level 2, then level 3, and the highest level is represented by a level 4.

The modules 16 are positioned in the mesh 14 so that there is an overlap along each of the plurality of substrates at levels 0–4. Vertical connectors and flat substrates are used to create the 3D-4N tetrahedral interconnect 14. The substrates overlap one another horizontally to allow connector mating. This is possible because only two of the four edges on each side of a substrate are used for connection, allowing uniformly sized substrates to be connected vertically with horizontal overlap but without horizontal interference. The result is a 3D-4N mesh that spirals up from the bottom level 0 to the top level 4.

The mesh is configured such that adjacent substrates are rotated in connector orientation, preferably about 90°, relative to each other. Thus, communication from any one substrate is generated in four different directions. For example, a module designated as a level 1 could vertically communicate data upward to two substrates designated as a level 2 and vertically communicate data downward to two substrates designated as level 0.

Three example axes of interconnection are illustrated at 15 in FIG. 4a. These axes correspond to the links of FIG. 3, with arrows pointing upwardly and to the links of FIG. 2. Corresponding nodes of FIGS. 2, 3 and 4a are indicated by like two-digit numbers preceded by figure number. For example, node 201 in FIG. 2 corresponds to node 301 in FIG. 3 and node 401 in FIG. 4a. It can be seen from the figures that node 401 connects downwardly in the x direction. It would also connect upwardly in the y direction with substrates not shown. The adjacent substrates 403 and 405 on the lower level 3 can connect downwardly in the y direction to substrates 407, 409 and 411, 413, respectively, and upwardly in the x direction. The level 2 substrates then connect downwardly in the x direction to, for example, modules 415 and 417. Finally, the spiral is complete with connections downwardly in the y direction to module 419.

It can be seen that, though vertical connectors are used, the effective axes of connection are not along the z axes of the figures. For example, the connections from substrate 405 are in the (z, −x), (z, x), (−z, y) and (−z, −y) directions. The axes of connection in the adjacent levels, both levels 2 and 4, are in the (−z, x), (−z, −x), (z, −y) and (z, y) directions. From the above listings, it can be seen that adjacent modules have connections in opposite directions along the same axes. For example, the (−z, x) direction of level 2 modules is directly opposite to the (z, −x) direction of level 3 and so on. As discussed below, there are two orientations of modules characterized by the directions of connection.

Within the mesh of modules are unoccupied spaces that form a plurality of serpentine channels 25 that convey cooling fluid throughout the mesh. As fluid is forced vertically through the channels, a turbulent flow of air is created within the mesh. The turbulent air flows through the many cross-over passages to evenly cool all heat dissipating substrates 16 within the mesh 14.

The plurality of air channels can be closed to any degree to permit the mesh 14 to be consolidated into a denser interconnection if desired. Consolidation is done by moving the substrates closer to each other within each level, thus increasing the horizontal overlap between level. A dense interconnection is desirable for attaining a faster and more efficient computer network. The 3D-4N mesh of the present invention has the capability to be indefinitely dense, but such a structure would have limited cooling capability.

The diamond lattice 3D-4N network 14 has an isotropic topology, which means that any logical subtree observed from any port of any substrate in an infinite network is isomorphic (substantially identical) to all other subtrees observed from that or any other substrate in the same network.

A further characteristic of this diamond lattice 3D-4N network is the mechanical homogeneity of the assembly where all substrates are mechanically identical at their interfaces. Thus, any node may be placed in any position within the network and maintain the mechanical integrity of the network. Although the nodes are homogeneous they may be merely mechanically compatible and perform different logical functions.

FIGS. 4b shows a more detailed view of the modules 16 within the 3D-4N mesh of FIG. 4a. Each module includes circuits 18, sockets 19 and pins 21. The sockets 19 are placed along opposite sides of each flat surfaced substrate for joining modules above. Pins 21 are placed underneath each of the flat surfaced substrates at opposite sides for connecting modules below. The pins and sockets of each module are complementary to the sockets and pins of each adjacent modules. Thus, the plurality of substrates are joined together through respective sockets and pins.

FIG. 4b shows modules each communicating with adjacent modules via their respective connector sets. For example, a module designated as level 2 communicates with the circuits of modules designated as levels 1 and level 3. This configuration allows information from modules to propagate in four directions.

Each module is connected to its neighbors only in the vertical dimension, meaning that individual boards may be removed from, or added to, the top of the machine in the fashion of bricks. At each step of assembly or disassembly, the mating or unmating force of only half of a single board's connectors must be applied, and alignment need only be accomplished on the scale of a single node's width.

The mesh of the present invention obviates the problem associated with the 6-neighbor Cartesian three-dimensional system (3D-6N) of FIG. 1, which is built from very large circuit boards stacked atop one another via a number of connectors with a total of thousands of pins. To repair an interior fault, a mechanical access operation must take place which usually means splitting the entire machine along a two-dimensional plane intersecting the defective part.

Figure 5A:
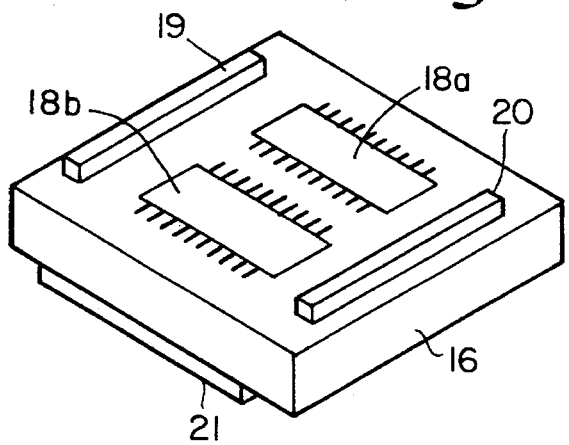
FIGS. 5a and 5b show detailed views of modules embodied in the 3D-4N mesh.

FIG. 5a shows integrated circuits 18a and 18b placed on the top surface of a module. The circuits allow each node to process data and communicate with other circuits on adjacent nodes through their respective connector sets. For example, chip 18a may provide the intermodule communications control and switching circuitry while chip 18b provides local node processing.

Figure 5B:
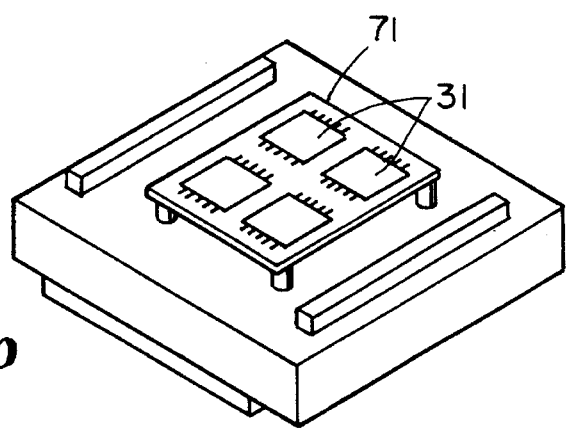

In an embodiment with minimal horizontal overlap, only one quarter of the three dimensional volume is occupied. This leaves a vertical space for auxiliary boards such as "daughterboards" to be plugged atop each substrate. Also, this space could be used for distributed peripherals such as disk drives. FIG. 5b shows a daughterboard 27 standing over the substrate. On top of the daughterboard are four integrated circuits 31. The multi-chip module allows each node to increase its communication and processing capabilities.

The plurality of modules facilitate communication in the mesh through the use of cross-point switches and registers which are supported by each respective module. The cross-point switches and registers provide a parallel connection among the plurality of modules.

The hardware complexity of the 3D-4N interconnect 14 is characterized by the cross point switches which have a high performance switching node of C channels, each of width W, that grows roughly with $O(C^2W)$. Networks such as the 3D-6N neighbor mesh utilize 6 neighbor switches, with one channel for each direction of travel along each orthogonal dimension. By utilizing a 4 neighbor topology instead of 6, the tetrahedral interconnect 14 realizes a reduction of switch complexity. Keeping the number of communications pins per node (C W) constant, we have $$C_4 = \frac{2}{3} C_6 \text{ and } W_4 = \frac{3}{2} W_6$$

The 4 and 6 sub-units denote 4 neighbor and 6 neighbor networks, respectively. This yields a switch complexity for the 4 neighbor switch which is ⅔ (66%) as large as that of the total pin equivalent 6 neighbor switch. If an additional channel is used for communications to the local node, then a 5 neighbor is compared to a 7 neighbor switch, and the savings are somewhat reduced to 5/7 (75%), but are still substantial.

In a mesh, a significant portion of the signal propagation delay of a cross-point switch drops linearly with a reduction of its capacitive load. This load corresponds roughly to the number of switched channels. Thus, there is a significant decrease of individual switching node latency (or, equivalently, an increase in network clock frequency) in 4 neighbor switches versus 6 neighbor switches due to the lower number of channels.

The 3D-4D tetrahedral interconnect 14 as shown in FIG. 4a is isotropic. An anisotropic 3D-4N network may be constructed by removing two of the six channels connecting each node of a 6N 3D mesh. The configuration would appear as in FIG. 1, with each module having connections on its top and bottom surfaces as well as two opposite lateral faces. The lateral connections would alternate in X and Y directions with successive vertical levels.

Unfortunately, if channel widths are uniform, such a network has unequal bandwidth along the three directions of travel, making intelligent routing and load distribution a complex matter. In order to balance network load, it becomes necessary to relocate communicating processes further apart along the directions of high network bandwidth and closer together along the directions of low network bandwidth. Alternatively, one may vary the number of pins dedicated (i.e., the width) per channel in each dimension. Overall, the anisotropic network is inferior to an isotropic network of equivalent channel and pin count.

As discussed above relative to FIG. 4a, adjacent substrates connect in opposite directions. It is seen that two node orientations are present, as distinguished by the X, Y and Z (depth) offsets of their connections to neighboring nodes:

TABLE 1

| Connection Offset to Neighbor | | | | | |
|---|---|---|---|---|---|
| Orientation 0 | | | Orientation 1 | | |
| X | Y | Z | X | Y | Z |
| +1 | 0 | −1 | −1 | 0 | +1 |
| −1 | 0 | −1 | +1 | 0 | +1 |
| 0 | +1 | +1 | 0 | −1 | −1 |
| 0 | −1 | +1 | 0 | +1 | −1 |

Node orientations of the present invention are labeled as '0' and '1'. Note that the available link offsets of each node orientation are negative of one another, i.e., orientation '0' nodes only connect to orientation '1' nodes, and vice versa.

Each node-to-node connection involves an increment or decrement in either the X or Y directions (but not both) and always an increment or decrement in the Z (depth) direction.

In the Cartesian 3D-6N network of FIG. 1, messages usually travel along "Manhattan" routes, with each step being made in the direction of one of the orthogonal axes. The tetrahedral interconnect 14, despite being a three-dimensional topology, has 4 non-orthogonal directions of travel, corresponding to the 4 link offsets which are shown in Table 1. Thus, it is difficult to describe the node coordinates and routing directions of the tetrahedral interconnect in a three coordinate system.

A simplified addressing scheme is obtained by utilizing a 4 coordinate or 4-dimensional addressing system. In the 4-D addressing system, the direction of each link axis in the diamond lattice corresponds to one of the 4 dimensions.

As mentioned above, there are two node orientations in the tetrahedral interconnect. At any node, a message may only travel on any one of the 4 dimensions in a single direction. Having traveled one link in that direction, the message arrives at a node of the opposite orientation, and may not continue along that same dimension in the same direction. Instead, travel must proceed in the opposite direction, along any of the 4 dimensions.

For the sake of uniformity, traveling from any orientation '0' node to any orientation '1' node has an offset value of +1, while traveling from any orientation '1' node to any orientation '0' node has an offset value of −1. The mapping of 3-D position offsets [X,Y,Z] to 4-D address offsets [A,B,C,D] is indicated in Table 2.

TABLE 2

| 3-D Position | | | 4-D Position | | | |
|---|---|---|---|---|---|---|
| X | Y | Z | A | B | C | D |
| Offset to Neighbor: Orientation 0 Node | | | | | | |
| +1 | 0 | −1 | +1 | 0 | 0 | 0 |
| −1 | 0 | −1 | 0 | +1 | 0 | 0 |
| 0 | +1 | +1 | 0 | 0 | +1 | 0 |
| 0 | −1 | +1 | 0 | 0 | 0 | +1 |
| Offset to Neighbor: Orientation 1 Node | | | | | | |
| −1 | 0 | +1 | −1 | 0 | 0 | 0 |
| +1 | 0 | +1 | 0 | −1 | 0 | 0 |
| 0 | −1 | −1 | 0 | 0 | −1 | 0 |
| 0 | +1 | −1 | 0 | 0 | 0 | −1 |

The center network node is labeled [0,0,0,0] and arbitrarily declared to be orientation '0'. A message may travel from the center node [0,0,0,0] to either [1,0,0,0], [0,1,0,0], [0,0,1,0] or [0,0,0,1]. Once at this second node (an orientation '1'), the direction of travel may be on any of the 4 dimensions, but is restricted to be in the opposite direction, i.e., an address increment of −1. For example, if the second node was [1,0,0,0], the message may now travel to a third node at either [0,0,0,0], [1,−1,0,0], [1,0,−1,0] or [1,0,0,−1].

Since continued travel must invoke alternating address coordinate increments of +1 and −1, the sum of the 4D address coordinates is constrained to be 0 on all orientation '0' nodes (those being an even number of hops away from the central node), and +1 on all orientation '1' nodes (those having an odd number of hops away from the center). Thus, the coordinate sum is exactly equal to the node orientation, and is also equal to the parity of the routing distance from the center.

By induction, one can show that any address whose 4 coordinates sum to either 0 or 1 is a valid node address. The sum-to-0 or sum-to-1 constraints correspond to forcing the node coordinates to lie on one of two 4-dimensional hyperplanes, with each hyperplane corresponding to the orientation of the node. Since links only connect orientation '0' to orientation '1' nodes (and vice versa), messages cannot travel directly within each hyperplane. Instead, they must zig-zag between the two.

Since the present invention uses a 4-D address, there may be concern as to how well defined the addressing system is. The 4-D address space is well defined if:

1. No two nodes may be assigned the same address.
2. No two addresses may be assigned the same node.

Since we know that physical node locations in 3-space are unique, verifying these two properties equates to demonstrating that the mapping from 3-D locations to 4-D addresses is one-to-one.

If we label a center node [0,0,0,0], and use the offsets indicated in the table above, a node's 3-D position ([X,Y,Z]) may be calculated from its 4-D address ([A,B,C,D]) as follows:

$$\begin{bmatrix} X \\ Y \\ Z \\ T \end{bmatrix} = \begin{bmatrix} A & +1 & -1 & 0 & 0 \\ B & 0 & 0 & +1 & -1 \\ C & -1 & -1 & +1 & +1 \\ D & +1 & +1 & +1 & +1 \end{bmatrix}$$

Note that a fourth quantity T has been added to the 3-D physical coordinate which indicates the orientation (either 0 or 1) of the node, and is given by the sum of its 4-D address.

From the above equation, a 4-D address [A,B,C,D,] is seen to map to only one 3-D location and orientation [X,Y,Z,T].

The right hand matrix has a unique inverse, so that:

$$\begin{bmatrix} A \\ B \\ C \\ D \end{bmatrix} = \begin{bmatrix} X & +1/2 & 0 & -1/4 & +1/4 \\ Y & -1/2 & 0 & -1/4 & +1/4 \\ Z & 0 & +1/2 & +1/4 & +1/4 \\ T & 0 & -1/2 & +1/4 & +1/4 \end{bmatrix}$$

Thus, a given 3-D location (and orientation, which is necessarily constrained to have only one value) maps to only one 4-D address. The mapping is therefore one-to-one.

The 4-dimensional addressing scheme allows routing within the tetrahedral interconnect in a Manhattan-style fashion, albeit, with 3 out of every 4 streets (links) missing. The missing links limit the number of available routes, but the computation of route-distance is still the same. One simply sums the address differences over all 4 coordinates to obtain the minimum number of links that must be traversed.

At each step along a minimal distance route, a choice of at most 3 directions of travel is possible (if one is not at the destination, the difference between the current and desired address can have at most 3 non-zero coordinates of the same sign). If one is at an orientation '0' node, the next hop will add 1 to one of the dimensions, thus one has the choice of any of the dimensions whose target coordinate is greater than the corresponding coordinate of the current node. For some minimal routes (i.e. [0,0,0,0] to [0,0,10,–10]) there is no choice whatsoever.

Deadlock-free adaptive routing schemes that work for Cartesian 3D-4N meshes also work for the 3D-4N tetrahedral interconnect, provided that the 4-D addressing scheme is used (which provide Manhattan routing) and that each "missing" link in 4-D is marked as unavailable to the router. The 3D-4N tetrahedral interconnect has straight through channels which only last a single "hop" before a turn is required. The new deadlock-free routing scheme of the present invention significantly improves performance and load balancing in the tetrahedral interconnect.

One example of such a routing scheme involves the grouping of pairs of links as the means to route from one node of a given type to another node of the same type. Let us assume arbitrarily that the beginning node is in orientation 1, and that a route to another orientation 1 node is required. This means that an even number of hops must be used, i.e. first subtract 1, and then add 1 to pairs of address coordinates until the destination is reached (if the 4-D address has 4 bins filled with varying numbers of tokens, this corresponds to removing a token from one bin and depositing it in another).

At any node, the choice of which pair of coordinates to decrement and then increment involves a choice of 1 of 12 possibilities. This corresponds to 2 polarities of double-hop travel along 6 different unsigned directions. This is not to suggest a 6-dimensional addressing scheme, which is easily shown to be not well defined (i.e., there are two distinct paths between two nodes with different 6-D address offsets). The 6 directions are more useful for direct routing than the 4 Manhattan address dimensions because travel may continue in the same direction for successive double-hops. Thus, a routing strategy that utilizes strict ordering of travel directions to avoid deadlock (and adaptive modifications of such) can now be used directly, albeit, with six considered directions of travel (instead of the usual three) at each node. In a non-adaptive system, at each intermediate node, one would route as far as possible along each of the six double-hop directions until the destination was reached.

Since each link in the double-hop routing scheme is used for three different signed directions of travel, a buffering of three words in each signed link direction is required.

Figure 6:
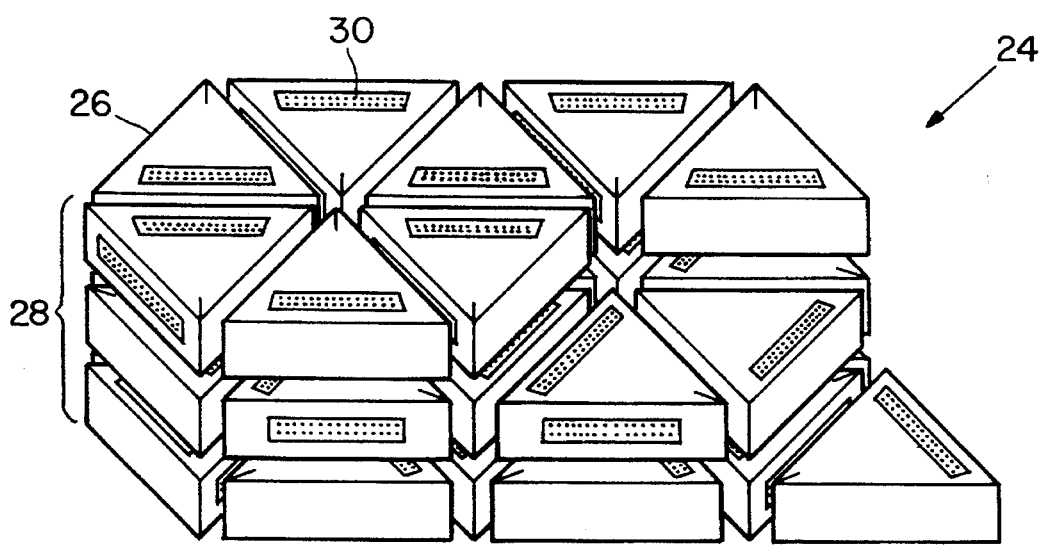
FIG. 6 shows a 3D-3N communications interconnect.

FIG. 6 shows another three-dimensional mesh (3D-3N) 24 constructed from 3-neighbor nodes or substrates (3D-3N) formed from physically triangular solids. Each node in this diagram comprises a flat solid whose cross-section is an equilateral triangle. Three nodes are stacked vertically to form a drum 28. Drums are assembled into vertical columns which are then close-packed in the two horizontal dimensions.

Each node 26 communicates with vertically adjacent neighbors through connectors 30 offset by 120°, so that nodes in a column are rotated with respect to one another. The third communication port of each node is on one of the rectangular lateral faces and mates with a similar port of a laterally adjacent node. One connector is placed on the upper face, another on the lower face, and the last on one of the side faces.

Figures 7A, 7B:
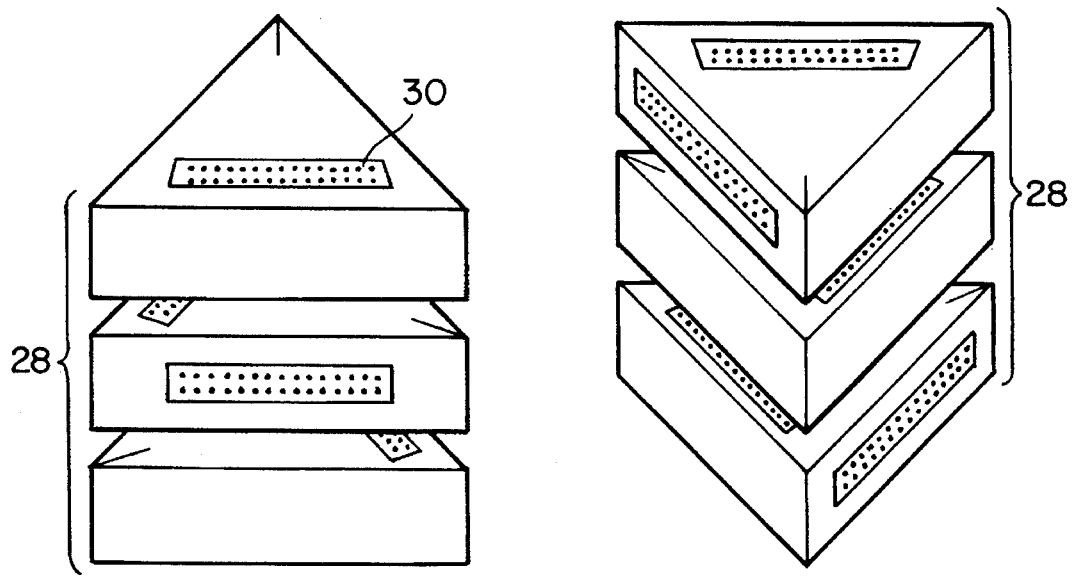
FIGS. 7a and 7b show a front and backview of a drum embodied in the 3D-3N communications interconnect.

FIGS. 7a and 7b show a front and back view of the drum. Each drum 28 communicates with five neighboring drums, wherein connections with the three lateral neighbors are at different levels within the drum. Lateral communication between neighboring drums typically requires vertical communication to reach a layer with the appropriate lateral connection. The connectors on the vertical faces form a spiral with each face having a connector.

In order for a node group to tessellate in 3-space, a connector is placed on each collective face. The condition that upper and lower connectors be on distinct faces of the triangular node ensures that the nodes' orientation spirals through a vertical column. Therefore, the drum 28 has a minimum node group that satisfies the connector-on-each-face condition.

Figure 8:
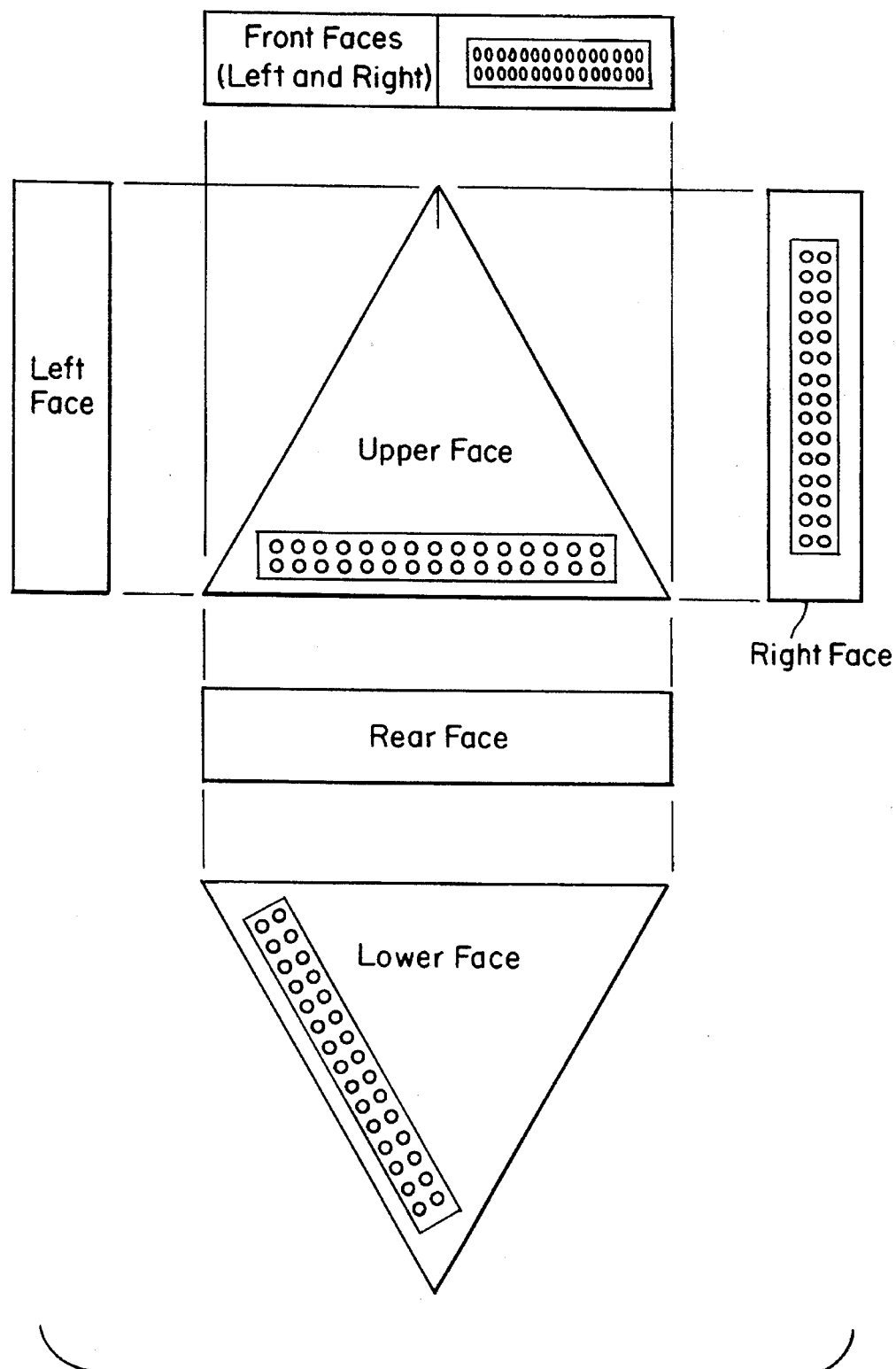
FIG. 8 shows the module of FIGS. 7a and 7b in plan and side views.

If the drums shown in FIGS. 7a and 7b is interpreted with the views shown in FIG. 8, the drums, if pushed together from the right and left, will mate properly (recall the edge connector is rotationally to the right of the orientation mark). Thus, the column may have an arbitrary height, with adjacent columns rotated 120° relative to each other.

The 3D-3N mesh 24 of the present invention may have rectangular nodes instead of triangular nodes. One possibility is a 3D-3N mesh constructed with rectangular nodes is composed of four blocks rather than the three since there are four vertical faces. Another possibility is to create drums of 3 nodes out of rectangular nodes by not putting connectors on one of the sides of the rectangle. The drums may still be put together in a way that preserves the topology of the triangular-node system.

While the invention has been particularly shown and described in conjunction with a preferred embodiment thereof, it will be understood that many alternatives, modifications, and variations will be apparent to those skilled in the art without departing from the spirit and scope of the invention as defined by the appended claims. For example, though connectors are shown mounted to preferred vertical and horizontal surfaces, they may, for example, be mounted on beveled edges such that they are directed at an angle. The terms vertical and horizontal are simply relative terms and do not limit the orientation of the array.

We claim:

1. A three-dimensional electronic circuit assembly comprising:

a plurality of data processing modules comprising respective integrated electronic circuits for performing data processing operations and controlling communications between modules, each module having at least three sets of connectors along fewer than six surfaces thereof for joining the circuits on the modules to adjacent modules to enable communications between modules via the sets of connectors, each one of the sets of connectors supporting multiple electrical connections to other modules, adjacent modules being oriented relative to each other such that adjacent modules interconnect in a three-dimensional array having levels; and a common clock signal that is supplied to the modules of the array.

2. A three-dimensional electronic circuit assembly according to claim 1, wherein each module communicates with three other modules.

3. A three-dimensional electronic circuit assembly according to claim 1, wherein each module communicates with four other modules.

4. A three-dimensional electronic circuit assembly according to claim 3, wherein the integrated electronic circuits of the modules address the communications between each other within the array by four element vectors.

5. A three-dimensional electronic circuit assembly according to claim 1 wherein the three-dimensional array is an isotropic lattice.

6. A three-dimensional electronic circuit assembly as claimed in claim 1 wherein the data processing modules each comprise a plurality of integrated electronic circuit chips.

7. A three-dimensional electronic circuit assembly according to claim 1 further comprising auxiliary circuit boards mounted to the modules.

8. A three-dimensional electronic circuit assembly according to claim 1 wherein each of the connectors connects along an axis orthogonal to the levels.

9. A three-dimensional electronic circuit assembly as claimed in claim 1 wherein the three-dimensional array forms a lattice structure which is isomorphic with a diamond lattice.

10. A three-dimensional electronic circuit assembly according to claim 1 wherein each module of the array is in only one of two orientations, each orientation having different directions of interconnection, each module being connected only to modules of the opposite orientation.

11. A three-dimensional electronic circuit assembly according to claim 10 further comprising a two-phase clock input for controlling communications between modules, modules of opposite orientation operating on opposite phases of the clock.

12. A three-dimensional electronic circuit assembly according to claim 1, wherein the sets of connects are located on opposed surfaces of the modules and rotated with respect to each other around an axis that is orthogonal to the surfaces.

13. A three dimensional electronic circuit assembly according to claim 1, wherein different modules operate in response to different phases of the clock signal.

14. A three-dimensional electronic circuit assembly according to claim 1, wherein the integrated electronic circuits comprise a microprocessor.

15. A three-dimensional circuit assembly comprising:

a plurality of modules having opposed surfaces and including circuits for performing data processing operations and controlling communications with other modules, each surface supporting a pair of like, parallel, extended connector sets providing communication paths between modules, the connector sets on opposite surfaces of the modules being complementary to each other and rotated relative to each other, modules being joined to adjacent modules such that the modules define a three-dimensional lattice; and auxiliary circuit boards mounted to substrates within modules.

16. A three-dimensional circuit assembly according to claim 15, wherein the plurality of modules are spaced horizontally within levels such that there are serpentine vertical flow paths between the plurality of modules.

17. A three-dimensional electronic circuit assembly according to claim 15 wherein the modules are addressed within the array by a four element vector.

18. A three-dimensional electronic circuit assembly as claimed in claim 15 wherein the circuits comprise a plurality of circuit chips on each module.

19. A three-dimensional electronic circuit assembly according to claim 15 wherein each module is in one of two orientations, each orientation having different directions of interconnection, each module being connected only to modules of the opposite orientation.

20. A three-dimensional electronic circuit assembly according to claim 19 further comprising a two-phase clock input for controlling communications between modules, modules of opposite orientations outputting signals with opposite phases of the clock.

21. A three-dimensional circuit assembly as claimed in claim 15, wherein the modules are organized in stacked horizontal levels and the connector sets of each surface of each module connect to different modules of a higher or lower level.

22. A three-dimensional electronic circuit assembly comprising:

a plurality of modules supporting respective circuits, each module having connectors for connecting to adjacent modules of a three-dimensional array of modules along four axes, adjacent modules being connected along a single common axis but being rotated relative to each other such that connections from adjacent modules are made in opposite directions; and a two-phase clock input for controlling communications between modules, modules of opposite orientation operating on opposite phases of the clock.

23. A three-dimensional electronic circuit assembly according to claim 22, wherein the modules are addressed within the array by a four element vector.

24. A three-dimensional electronic circuit assembly according to claim 22, wherein the connectors provide vertical connections.

25. A method of providing a three-dimensional electronic circuit assembly, including the steps of:

provide a plurality of modules;

supporting circuits on the plurality of modules;

connecting adjacent modules along fewer than six module axes such that the connected modules are rotated relative to each other to form a three-dimensional array, each module assuming one of two orientations; and clocking a module to communicate in alternate phases of a clock signal according to orientation.

26. A method according to claim 25, further including the step of each module addressing every other module with a four element vector.

27. A method according to claim 25, wherein each of the connected modules communicates with only three other modules.

28. A method according to claim 25, wherein the connected modules each communicate with only four other modules.

29. A method according to claim 25, wherein the three-dimensional array is isotropic.

30. A method according to claim 25 wherein the modules are connected through vertical connections.

31. A method according to claim 25, wherein the three-dimensional array is isomorphic with a diamond lattice.

* * * * *